United States Patent [19]

Collins

[11] Patent Number: 4,962,441
[45] Date of Patent: Oct. 9, 1990

[54] ISOLATED ELECTROSTATIC WAFER BLADE CLAMP

[75] Inventor: Kenneth S. Collins, San Jose, Calif.

[73] Assignee: Applied Materials, Inc., Santa Clara, Calif.

[21] Appl. No.: 335,556

[22] Filed: Apr. 10, 1989

[51] Int. Cl.⁵ .......................................... H02N 13/00
[52] U.S. Cl. ..................................... 361/234; 118/500; 29/900
[58] Field of Search ................................ 361/233–235, 361/145; 250/440.1, 442.1, 492.2; 29/900; 226/94; 271/18.2, 193; 118/500

[56] References Cited

U.S. PATENT DOCUMENTS

| 4,502,094 | 2/1985 | Lewin et al. | 361/234 |
| 4,724,510 | 2/1988 | Wicker et al. | 361/234 |
| 4,733,632 | 3/1988 | Ohmi et al. | 118/729 |

FOREIGN PATENT DOCUMENTS 7900510  8/1979  PCT Int'l Appl. .................. 361/234

Primary Examiner—A. D. Pellinen
Assistant Examiner—David Osborn

[57] ABSTRACT

An electrostatic-clamping robotic-type semiconductor wafer-holding blade designed to optimize the electrostatic clamping force and decrease the required clamping voltage. The wafer blade includes: a base; interleaved electrodes formed on the base, alternating electrodes being connected in common electrically; and preferably a layer of dielectric material such as $Al_2O_3$ having a thickness ranging between 2 mils and 15 mils disposed over the interleaved electrodes and the base to minimize the applied voltage necessary to flatten the wafer against the blade, without dielectric breakdown. The ratio of electrode width to the distance between electrodes ranges from 3/1 to 2/1 to optimize the electrostatic clamping force exerted by the blade.

8 Claims, 2 Drawing Sheets

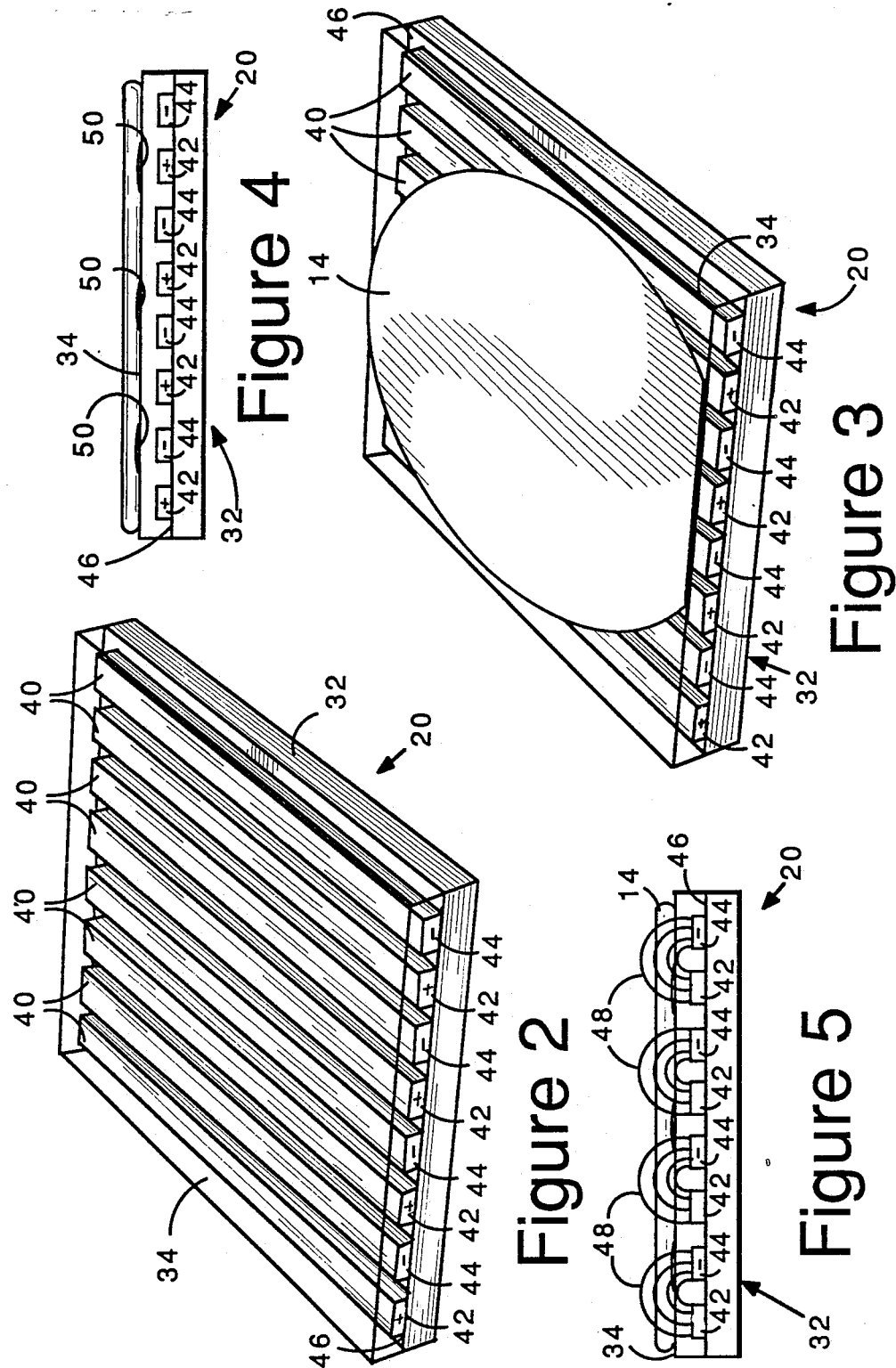

ISOLATED ELECTROSTATIC WAFER BLADE CLAMP

The present invention relates generally to a semiconductor wafer transport blade which incorporates electrostatic wafer clamping utilizing interleaved electrodes and, more particularly, to apparatus and method for maximizing the electrostatic clamping force generated between a wafer transport blade and a semiconductor wafer to prevent slippage of the wafer off the blade during blade accelerational movement.

BACKGROUND OF THE INVENTION

In semiconductor wafer fabrication systems, it is necessary to transport wafers between processing chambers for deposition, etching or the like. Wafer transport is typically performed by clamping the wafer to a mechanical arm. Prior art clamping techniques include mechanical clamping, vacuum clamping and electrostatic clamping. Controlled precisional movement of the mechanical arm permits insertion and removal of the wafer at the various processing chambers.

In U.S. Pat. No. 4,184,188, an electrostatic wafer clamp is disclosed. The clamp includes a blade with a multiplicity of parallel interleaved positive and negative paired electrodes arranged on the blade surface. A dielectric layer is disposed over the positive and negative electrodes forming a multiplicity of capacitors on the blade surface. A fringing of electrostatic forces occurs in between the positive electrodes and the negative electrodes of each capacitor pair during electrode energization. When a polarizable wafer is placed over the charged electrodes, the fringing electrostatic forces pass through the area occupied by the wafer. This creates a clamping force as the negative charges in the wafer polarize over the positively charged electrodes, and positive wafer charges polarize over the negatively charged electrodes. The clamping force is directly proportional to the electrostatic force acting upon the wafer.

To our knowledge, there is available only one wafer transfer or feeding apparatus utilizing an electrostatic wafer clamp. In U.S. Pat. No. 4,733,632, the wafer transfer apparatus includes a movable arm, an electrostatic chuck mechanism having a vertically moving support member attached to the moving arm, and a moving mechanism for moving the support member.

Wafer transport is accomplished by positioning the electrostatic chuck above the wafer to be transferred. The electrostatic chuck has two semi-circular electrodes, electrically isolated from each another by an insulating film formed over each electrode. The electrodes are arranged to fit around the periphery of the top surface of the wafer to be clamped. The periphery of wafers generally is not processed, and therefore provides a suitable clamping surface. The electrodes are energized with a direct current voltage, thereby inducing an electrostatic force between the wafer and the electrodes which is sufficient to peripherally clamp the wafer to the chuck surface. Vertical movement of the support member attached to the chuck lifts the wafer and controlled movement of the arm section effects wafer transfer.

Various problems are associated with peripheral electrostatic wafer chuck transport. The chuck comes in physical contact with the top surface of the wafer. Due to misalignment, the chuck may come into physical contact with the sensitive transistors fabricated on the wafer's top surface, which increases the probability of contamination or damage to the transistors. Furthermore, when the chuck releases the wafer after clamping, discharging current will pass through the top surface of the wafer. This also may damage the sensitive transistors on the wafer.

Accordingly, there is a need for a wafer transport blade wherein electrostatic clamping is achieved by clamping the bottom substrate surface of the wafer to the top surface of the wafer blade. Also, there is a need for a wafer transport blade which maximizes the clamping force per unit voltage. Such an apparatus and method will prevent wafer slippage off the blade during accelerational movement of the blade, reduce wafer contamination, and reduce probability of damage to transistors during electrostatic clamping discharge.

SUMMARY OF THE INVENTION

In view of the above discussion, it is an object of the invention to provide an electrostatic wafer transport blade wherein the bottom substrate surface of a semiconductor wafer rests upon the blade and is electrostatically clamped to the blade by inducing a fringing electrostatic clamping force in the area occupied by the wafer resting on the blade.

Another object of the invention is to maximize the clamping force per unit of voltage and to prevent wafer slippage during wafer transfer.

To achieve the foregoing and other objects and in accordance with the purpose of the present invention, there is provided an apparatus and method for optimizing the clamping force of an electrostatic wafer blade per unit of input voltage to facilitate wafer-flattening and thereby enable clamping of the wafer to the blade and to prevent wafer slippage off the blade during accelerational movement of the blade. The wafer transfer blade apparatus includes: a base; at least one pair of interleaved electrodes formed on the base, alternating electrodes being connected in common electrically; and a layer of dielectric material having a thickness ranging between 2 mils and 15 mils disposed over the interleaved electrodes on the base. Preferably the ratio of electrode width to the distance between electrodes is within the range of 3/1 to 2/1.

The method of the present invention includes placing a wafer to be transported on a top surface of a blade having interleaved electrodes of the preferred width/spacing ratio; applying a minimum voltage to the electrodes on the blade selected to induce an electrostatic force in the area occupied by the wafer sufficient to flatten the wafer and clamp it to the blade; and, using a mechanical arm attached to the blade, effectuating controlled accelerational movement of the wafer, whereby said clamping force flattens the wafer and holds the wafer onto the blade.

BRIEF DESCRIPTION OF THE DRAWINGS

Additional objects and features of the invention will be more readily apparent from the following detailed description and appended claims when taken in conjunction with the drawings, in which:

FIG. 2 is a perspective view of the electrostatic blade clamp according to the present invention.

FIG. 3 is a top view of the electrostatic blade of FIGS. 1 and 2 clamping a semiconductor wafer according to the present invention.

FIG. 4 is a side view of the electrostatic blade of FIGS. 1 and 2 positioned under a semiconductor wafer prior to electrostatic clamping according to the present invention.

FIG. 5 is a side view of the electrostatic blade of FIGS. 1 and 2 specifically showing electrostatic force lines according to the present invention.

DESCRIPTION OF THE PREFERRED EMBODIMENTS

Figure 1:
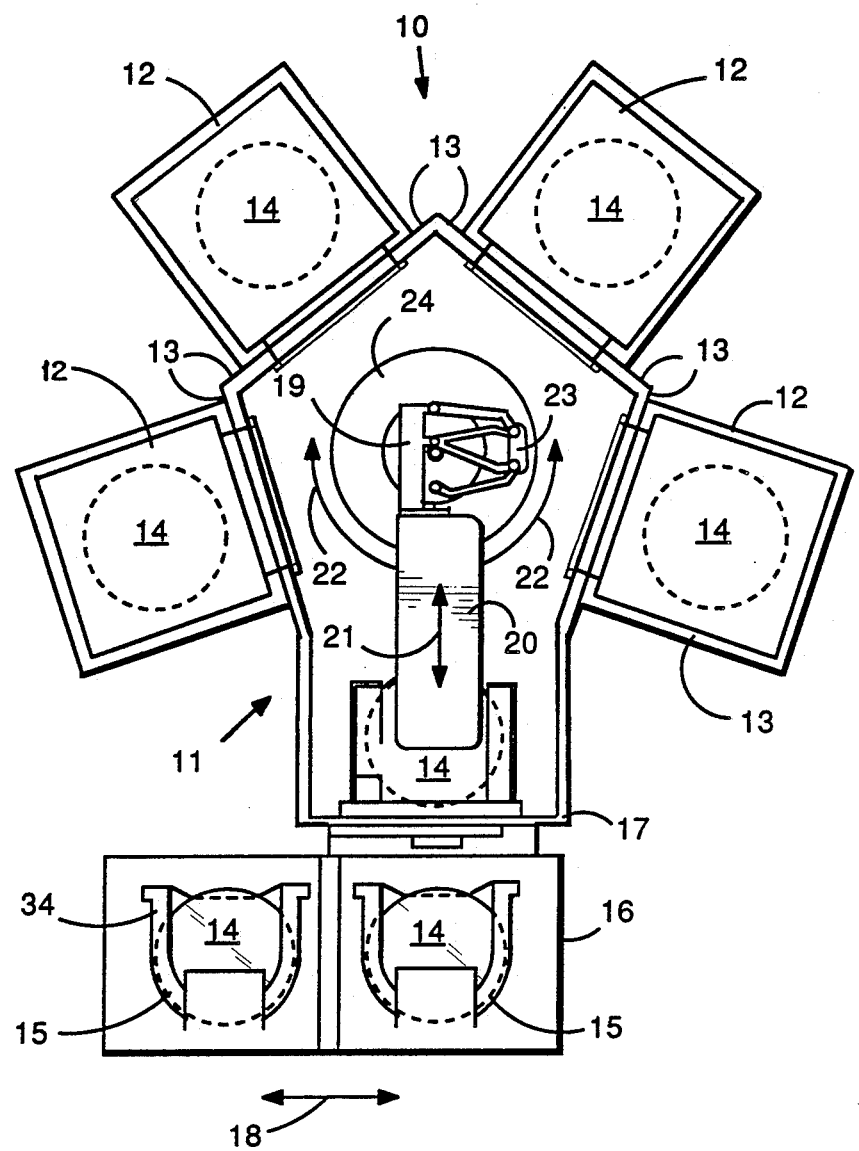
FIG. 1 is a simplified top view of in a semiconductor wafer processing system which incorporates an electrostatic wafer transport blade embodying the present invention.

FIG. 1 is a simplified top view of a multiple chamber integrated circuit processing system 10. The multiple chamber processing chamber 10 is described in detail in allowed, co-pending, commonly assigned, U.S. patent application Ser. No. 371,700, entitled MULTIPLE CHAMBER INTEGRATED PROCESS SYSTEM filed June 23, 1989 in the name of Mayden et al., which application is incorporated by reference in its entirety.

Illustratively, the multiple chamber 10 comprises an enclosed, generally polygonal-shaped vacuum loadlock chamber 11 which mounts several single wafer, vacuum processing chambers 12 on associated loadlock chamber walls 13 for processing a multiplicity of wafers 14 initially contained in standard plastic cassettes 15. The cassettes are mounted on an external cassette elevator 16 positioned adjacent the fifth chamber wall 17. As indicated by arrow 18, the external cassette elevator 16 is moveable, is indexable, horizontally and vertically to position the cassettes for loading unprocessed wafers into loadlock chamber 11 and for receiving processed wafers from the chamber.

The wafer 14 loading and unloading is done by a mechanical arm 19 comprising a wafer transport blade 20 which is mounted for reversible linear translation indicated by arrow 21 (R movement) and reversible rotation indicated by arrow 22 ($\theta$ movement). Specifically, a four bar link mechanism 23 imparts R movement while $\theta$ movement is provided by a rotatable platform 24 which mounts the four bar link mechanism 23 and the wafer transfer blade 20.

A vertical indexable internal wafer support elevator 34 is used to store wafers within the loadlock chamber 11 for transfer to the various processing chambers 12 without breaking vacuum in the system 10 and for processing in the loadlock chamber 11 itself.

Turning now to FIG. 2, a close up top view of the wafer blade 20 is shown according to the present invention. The wafer blade 20 includes a base 32 and a top surface 34. The base 32 is affixed to the end of a mechanical arm 19. During operation of the processing system 10, a wafer 14 is placed on and clamped to the top surface 34 of blade 20. With precisional movement of the mechanical arm 19, wafer 14 transport to and from the various chambers in system 10 is effectuated. It will be appreciated that in order to maximize performance, it is desirable that blade 20 comprise of an essentially non-conductive material. By way of example, in the embodiment chosen for purposes of illustration, the blade 20 is made of a ceramic material such as $Al_2O_3$.

A multiplicity of capacitors 40 are disposed on blade top surface 34. Each capacitor 40 includes a positive electrode 42 and a corresponding parallel negative electrode 44. The positive electrodes 42 are alternatively arranged with the negative electrodes 44, forming interleaved fingers on the blade top surface 34. By way of example, in the embodiment chosen for purposes of illustration, electrodes 42 and 44 are made of a conductive metal. Possible conductors include, but are not limited to silver aluminum and tungsten. The width of electrodes 42 and 44 and the spatial distance between these electrodes is hereinafter discussed.

A layer of dielectric material 46, with a predefined thickness hereinafter discussed, is disposed over the individual electrodes 42 and 44, and on top surface 34. The dielectric material 46 forms a smooth planar surface over top surface 34.

Referring now to FIG. 3, a close up top view of a wafer 14 resting on blade 20 is shown. During system 10 operation, mechanical arm 19 positions blade 20 underneath a wafer 14 to be transferred. When the wafer 14 is resting on top of blade 20, an energizing voltage is applied to electrodes 42 and 44 resulting in wafer 14 clamping to blade 20. With the controlled movement of the mechanical arm 19, the wafer blade 20 may be readily moved between the various chambers 11 and 12 without wafer 14 slippage off the blade 20.

Turning now to FIGS. 4 and 5, the clamping operation according to the present invention is described. FIG. 4 shows the blade 20 positioned under a wafer 14 prior to clamping. The substrate of wafer 14 physically rests upon the planar dielectric surface 46 of the blade 20. Air gaps 50 (exaggerated in size in FIG. 4 for clarity) exist between the dielectric plane 46 and the wafer substrate due to irregularities and bows in the wafer 14.

In the air or vacuum environment of system 10, the air gaps 50 have a dielectric constant approaching 1.00. Accordingly, when a clamping voltage is applied, most of the voltage potential drops between the electrodes 42 and 44 and the wafer 14 is due to the air gaps 50. As discussed in detail below, the gaps 50 dominate the voltage considerations required to electrostatically clamp the wafer 14 to the blade 20.

To effectuate clamping, a sufficient direct current voltage potential is applied between the positive electrodes 42 and the negative electrodes 44. Electrostatic forces, proportional to the density of the electrostatic lines 48 depicted in FIG. 5, are created between the positive electrodes 42 and negative electrodes 44. The clamping force is directly proportional to the electrostatic force between electrodes 42 and 44.

The resulting fringing electrostatic force in the area occupied by the wafer 14 causes a polarization of charges in the wafer 14. Positive charges in wafer 14 accumulate over the negatively charged electrodes 44. Negative charges in wafer 14 accumulate over the positively charged electrodes 42. With sufficient electrostatic fringing, the attractive force between the electrodes 42 and 44 and the polarized charges in the wafer 14 becomes sufficient to overcome the air gaps 50 and, as an attendant benefit, to retain the wafer on the blade even during periods of high acceleration.

Three parameters are of primary significance in maximizing the electrostatic fringing in the area occupied by the wafer 14. First, dielectric material and thickness; second, the width of electrodes 42 and 44; and third, the spatial relationship or distance between the electrodes 42 and 44.

Several factors are considered in selecting a dielectric material. The first consideration is the dielectric constant of the material. The higher the dielectric constant, the greater the force per unit voltage. The second consideration is the dielectric strength of the material. Dielectric strength is defined as the voltage limit the dielectric material can withstand before breakdown occurs and the dielectric material becomes a conductor. The third consideration is the dielectric static coefficient of friction of the material as discussed above. The fourth consideration is the dielectric material's thermal properties. During wafer processing procedures such as etching, wafer 14 can attain temperatures averaging 400° C. and peak temperatures at 700° C. Since a substantial portion of the wafer 14 thermal energy is absorbed by the dielectric layer 46, the dielectric 46 must be capable of withstanding such temperatures without melting, cracking or otherwise deteriorating.

Generally, the thinner the dielectric layer 46, the greater the electrostatic fringing in the area occupied by the wafer 14. However, there are practical limitations which limit the reduction of thickness of the dielectric layer. For dielectric layers approximately 1 mil or less in thickness, it has been found that the dielectric material breaks down and loses its insulating properties at voltages required to overcome air gaps. As a result, current passes through the wafer, which severely increases the probability of transistor damage. Therefore, in the preferred embodiment according to the present invention, a dielectric thickness range between approximately 2 mils at the low end and approximately 15 mils at the high end is defined. It will be considered obvious to those skilled in the art, that as technological advances are made in dielectric material, the low end of the range of dielectric thickness may be reduced accordingly.

By way of example, in the preferred embodiment chosen for purposes of illustration, dielectric layer 46 is made of $Al_2O_3$. It has been found the $Al_2O_3$ is the most suitable dielectric material based on its performance with regard to each of the considerations discussed above. Other possible constituents include, but are not limited to AlN, $Si_3N_4$ and $SiO_2$.

The optimal electrode 42 and 44 width for maximizing electrostatic fringing has been found to range between approximately 120 mils at the high end to approximately 12 mils at the low end. The optimal spatial relationship or distance between the individual electrodes 42 has been found to range between approximately 40 mils on the high end to approximately 6 mils on the low end.

It has been found that an electrode width versus the spatial distance between electrodes ratio in the range of 3/1 to 2/1 maximizes electrostatic fringing in the area occupied by the wafer 14. In one embodiment of the invention, with a selection of 120 mils electrode width and a correlating ratio of 3/1, a 40 mils distance between the electrodes maximizes the electrostatic fringing 46. In another embodiment, with a selection of electrode width of 90 mils and a 3/1 correlation ratio, a 30 mils spacing between the electrodes maximizes electrostatic fringing 46. In yet another embodiment, with an electrode selection of 12 mils width and a correlation ratio of 3/1, 4 mils spacing between the electrodes maximizes electrostatic fringing 46. In any case, the interelectrode spacing should be several times the dielectric thickness for sufficient fringing into be wafer substrate to occur.

It will be appreciated, by those skilled in the art, that the above described correlation ratios all maintain a common characteristic. They tend to maximize the ratio of the conductive surface area provided by electrodes 42 and 44 surface relative to the non-conductive surface area on the blade 20.

Turning now to a specific embodiment of the invention, a five-step process is required to calculate the voltage necessary to prevent wafer 14 slippage during accelerational movement of blade 20. The five steps are herein described below.

The first step is to determine the force per area q required to overcome the air gaps 50 which exist between a silicia wafer 14 resting on the blade 20. The equation provides:

$$q = \frac{y_c \, 64D}{r^4} \cdot \frac{(1 + \text{poissons ratio})}{(5 + \text{poissons ratio})} \quad [1]$$

Assuming the wafer 14 is a circular disk of silica with simply supported edge boundry conditions and has the following dimensions:

(1) The wafer radius r=2.5 inches.
The wafer thickness t=0.020 inches.
(2) The poissons ratio for silicia=0.42
(3) The silicia modulous of elasticity equals:
$E=3.1\times 10^6$ lb/in$^2$
(4) The plate constant equals:
$D=(E.t^3)/12 \, (1-\text{poissons ratio}^2)$
(5) The air gaps which exist between the wafer and the blade (worst case) $y_c=0.010$ inches.

Accordingly, $q=1.08y_c=0.0115$ lb/in$^2$. In the second step, the force F the blade 20 is required to generate is calculated. Assuming the blade 20 is rectangular and has the following dimensions:
(1) 3.0 in × 4.5 in.
(2) Area$_{blade}$=13.5 in.$^2$,=$8.7\times 10^{-3}$ meters$^2$,
blade 20 is required to generate a force equal to:

$$F = q \times \text{blade}_{area} \quad [2]$$
$$= 0.155 \text{ lb or } .69 \text{ newtons}.$$

In the third step, the voltage required to generate an electrostatic clamping force equal to 0.155 lb is determined. The equation to calculate the required voltage provides:

$$V = \left[ F(X_{gap} + d_{film}) \cdot \left( \frac{X_{gap}}{A \, \epsilon_o \epsilon_{gap}} + \frac{d_{film}}{A \, \epsilon_o \epsilon_{film}} \right) \right]^{\frac{1}{2}} \quad [3]$$

where:

$F = 0.69$ newtons (1)

$X_{gap} = 1/2 \, y_c = .005$ in. $= 1.225 \times 10^{-4}$ meters (2)

$d_{film}$ = film dielectric thickness (3)
$= .002$ in. $= 5 \times 10^{-5}$ meters $\epsilon_{gap} = 1.0$ (dielectric constant of air or vacuum) (4)

$\epsilon_{film} = 9.0$ (dielectric constant of Al2O3) (5)

$\epsilon_o = 8.85 \times 10^{-12}$ F/meter (permittivity of free space) (6)

$A = 3 \times 10^{-3} \, M^2$ (1/2 approximate total electrode area). (7)

Based on equation [3] approximately 760 volts are required to flatten wafer 14. It should be noted, though, that even when the clamping voltage is applied, and the wafer is flattened, not all the air gaps 50 disappear. Accordingly, a new smaller gap $X_{gap}$, is used to denote the small gaps remaining with the flattened wafer.

In the fourth step, a higher clamping voltage of 1000 volts is used as a safety margin. The equation to calculate the wafer flattening force $F_C$ at 1000 volts is:

$$F_c = \frac{1}{\frac{X_{gap'}}{A\,\epsilon_0 \epsilon_{gap}} + \frac{d_{film}}{A\,\epsilon_0 \epsilon_{film}}} \cdot \frac{V^2}{X_{gap'} + d_{film}} \quad [4]$$

where $X_{gap'} = 1.0$ mil $= 2.54 \times 10^{-5}$ meter, and $V = 1000$ volts.

Based on equation [4] the wafer flattening force is:

$F_c = 11.4$ newtons $= 2.56$ lb.

In the fifth and final step, the tangential acceleration at which the wafer 14 will begin to slip off the blade 20 is determined. The equation to calculate $a_{slip}$ is:

[5] $a_{slip} = Fc \times K_s / M / M/S^2$, where:

$M = 0.015$ Kg (mass of wafer)
$K_s = 0.32$ (static coefficient of friction between silicia wafer and dielectric material $Al_2O_3$)
$F_c = 11.4$ newtons
$g = 9.8 M/S^2$.

Thus, at 1000 volts, the wafer will not begin to slip until a tangential acceleration of 24.8 g is attained, which provides a safety margin of an order of magnitude relative to the typical acceleration values of mechanical arm 19 in the range of 2-3 g.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method to maximize the electrostatic clamping force of a semiconductor wafer to a wafer transfer blade by optimizing the force per unit of input voltage for an selected applied voltage, comprising the steps of:

disposing a layer of dielectric material over at least one pair of interleaved electrodes of selected width on the top surface of a wafer transfer blade, said dielectric having a thickness ranging from approximately 2 mils to 15 mils and the ratio of the selected width of said electrodes and the distance between said electrodes being within the range 3/1 to 2/1; and applying a voltage across the electrodes sufficient to flatten the semiconductor wafer against the blade.

2. The method of claim 1, wherein the selected electrode width is within the range of about 12 mils to 120 mils.

3. The apparatus of claim 2, wherein said layer of dielectric is comprised of $Al_2O_3$ and the thickness thereof is within the range of about 2 mils to 15 mils.

4. The apparatus of claim 2, wherein said electrode thickness ranges from 12 mils to 120 mils.

5. The apparatus of claim 2, wherein said distance between the electrodes ranges from 4 mils to 40 mils.

6. The method of claim 1, wherein the distance between electrodes is within the range of about 4 mils to 40 mils.

7. A wafer transfer blade comprising:

a base;

at least one pair of interleaved electrodes formed on said base, alternating electrodes being connected in common electrically;

a layer of dielectric material over the interleaved electrodes and the base, said dielectric material having a thickness sufficient to prevent dielectric breakdown when a clamping voltage is applied; and means for applying a voltage between said alternating electrodes to generate an electrostatic clamping force between the blade and a semiconductor wafer positioned thereon;

the ratio of electrode width to between electrode spacing being within the range of 3/1 to 2/1 to enhance the electrostatic clamping force.

8. A method for transporting wafers in a wafer fabrication system utilizing an electrostatic wafer blade, comprising the steps of:

placing a wafer to be transported on a top surface of the blade, said top surface having at least one pair of interleaved electrodes, alternating electrodes being connected in common electrically; said electrodes having a width and a spatial distance between said electrodes based on a correlated ratio defined by (electrode width/distance between electrodes) ranging from 3/1 to 2/1;

applying a voltage to said electrodes on said blade sufficient to induce a wafer-flattening electrostatic force between the wafer and the blade; and accelerating the movement of the blade with a mechanical arm attached to the blade to effectuate controlled movement of the wafer in the system, whereby said clamping force holds the wafer onto the blade during accelerational movement.

* * * * *